United States Patent
Oshima et al.

(10) Patent No.: US 7,450,351 B2
(45) Date of Patent: Nov. 11, 2008

(54) MAGNETORESISTIVE ELEMENT HAVING CURRENT-PERPENDICULAR-TO-PLANE STRUCTURE, MAGNETIC HEAD, AND MAGNETIC MEMORY APPARATUS THEREOF

(75) Inventors: Hirotaka Oshima, Kawasaki (JP); Keiichi Nagasaka, Kawasaki (JP); Arata Jogo, Kawasaki (JP); Yutaka Shimizu, Kawasaki (JP); Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 487 days.

(21) Appl. No.: 11/156,870

(22) Filed: Jun. 20, 2005

(65) Prior Publication Data

US 2006/0209473 A1 Sep. 21, 2006

(30) Foreign Application Priority Data

Mar. 17, 2005 (JP) ............................. 2005-078007

(51) Int. Cl.
*G11B 5/33* (2006.01)
(52) U.S. Cl. .................................................. 360/324.12
(58) Field of Classification Search ....................... None
See application file for complete search history.

(56) References Cited

U.S. PATENT DOCUMENTS

| 6,654,211 | B2 | 11/2003 | Gill et al. |
| 7,223,485 | B2* | 5/2007 | Yuasa et al. .................. 428/812 |
| 7,292,415 | B2* | 11/2007 | Noma .................... 360/324.12 |
| 2003/0128484 | A1 | 7/2003 | Noma |
| 2003/0137785 | A1* | 7/2003 | Saito ..................... 360/324.11 |
| 2004/0246634 | A1* | 12/2004 | Yuasa et al. ............. 360/324.11 |
| 2005/0041342 | A1* | 2/2005 | Huai et al. .............. 360/324.12 |

FOREIGN PATENT DOCUMENTS

| CN | 1430205 | 7/2003 |
| JP | 2003-060263 | 2/2003 |

OTHER PUBLICATIONS

Nature, vol. 392; pp. 796-798; Apr. 23, 1998.

* cited by examiner

*Primary Examiner*—Angel A. Castro
(74) *Attorney, Agent, or Firm*—Greer, Burns & Crain, Ltd.

(57) ABSTRACT

A magnetoresistive element of a CPP type configuration including a fixed magnetic layer, a first non-magnetic layer, a free magnetic layer, and a second non-magnetic layer is disclosed. The magnetoresistive element includes a first interface layer situated between the free magnetic layer and the first non-magnetic layer, and a second interface layer situated between the free magnetic layer and the second non-magnetic layer. The first interface layer and the second interface layer include a material mainly having CoNiFe.

9 Claims, 9 Drawing Sheets

| | COMPOSITION OF FIRST AND SECOND INTERFACE MAGNETIC LAYERS | MAGNETIC RESISTANCE VARIATION ($m\Omega \cdot \mu m^2$) | COERCIVE FORCE (Oe) |
|---|---|---|---|
| EXAMPLE 1 | Co30Ni30Fe40 | 2.619 | 0.1 |
| EXAMPLE 2 | Co40Ni30Fe30 | 2.834 | 1.9 |
| EXAMPLE 3 | Co30Ni20Fe50 | 2.463 | 1.7 |
| EXAMPLE 4 | Co40Ni20Fe40 | 2.678 | 1.2 |
| EXAMPLE 5 | Co50Ni20Fe30 | 2.399 | 3.6 |
| EXAMPLE 6 | Co40Ni10Fe50 | 2.700 | 150.0 |
| EXAMPLE 7 | Co50Ni10Fe40 | 2.760 | 3.5 |

MAGNETORESISTIVE ELEMENT HAVING CURRENT-PERPENDICULAR-TO-PLANE STRUCTURE, MAGNETIC HEAD, AND MAGNETIC MEMORY APPARATUS THEREOF

BACKGROUND OF THE INVENTION

1. Field of the Invention

The present invention generally relates to a magnetoresistive element, a magnetic head, and a magnetic memory apparatus, and more particularly to a magnetoresistive element having a CPP (Current-Perpendicular-To-Plane) structure that allows a sense current to flow in a direction perpendicular to a spin valve film, a magnetic head, and a magnetic memory apparatus thereof.

2. Description of the Related Art

In recent years, a magnetoresistive element has been used in a magnetic head of a magnetic recording apparatus as a reproduction element for reproducing information recorded in a magnetic recording medium. The magnetoresistive element is mainly provided with a spin valve film having high magnetic field sensitivity for accommodating high recording densities. The spin valve film comprises layers which include a fixed magnetization layer in which the direction of magnetization is fixed in predetermined direction, a non-magnetic layer, and a free magnetic layer in which the direction of magnetization changes in correspondence with the direction or the strength of a leaking magnetic field of the magnetic recording medium. The value of the electric resistance of the spin valve film changes in correspondence with the angle that is formed by the magnetization of the fixed magnetization layer and the magnetization of the free magnetic layer. The magnetoresistive element reproduces bits recorded to the magnetic recording medium by applying a sense current of a predetermined value to the spin valve film and detecting the change of electric resistance (change of voltage).

Conventionally, a CIP (Current-In-Plane) structure, which allows a sense current to flow in an in-plane direction of the spin valve film, is used for the magnetoresistive element. However, in order to record with higher recording density, an increase in linear recording density and in track density of the magnetic recording medium is required. Accordingly, reduction of the width of the magnetoresistive element corresponding to the track width of the magnetic recording medium and the height of the magnetoresistive element (depth of magnetoresistive element), that is, reduction of the cross-sectional area of the magnetoresistive element is required. In such a case, the current density of the sense current becomes excessively large when the CIP structure is used for the magnetoresistive element. This leads to deterioration of performance of the magnetoresistive element due to, for example, migration of materials included in the spin valve film. In order to prevent such deterioration of performance, the amount of sense current is to be reduced. However, such reduction of sense current causes reduction in the amount of detected voltage change corresponding to the change of magnetic resistance, that is, reduction in reproduction output, to thereby result in deterioration of S/N ratio (signal to noise ratio).

Therefore, as a reproduction element of the next generation, vigorous research is being made for a magnetoresistive element using a CCP (Current-Perpendicular-To-Plane) structure that allows a sense current to flow in a direction perpendicular to the spin valve film.

In a case where the magnetoresistive element uses the CPP structure, the value of element resistance decreases since the thickness of the spin valve film is thin. Accordingly, a sufficient reproduction output cannot be obtained merely by using a material which is the same as that of the magnetoresistive element having the CIP structure since the amount of change of the magnetic resistance is small ($\Delta RA$). Therefore, in order to obtain a sufficient recording output for the magnetoresistive element having the CPP structure, a large change amount of the magnetic resistance per unit area ($\Delta RA$) is desired to be provided to the spin valve film.

In order to increase $\Delta RA$, a magnetoresistive element having a thin insertion layer (e.g. Co—Fe alloy or a Co—Ni alloy) provided between a free magnetic layer and a non-magnetic layer is proposed (See, for example, Japanese Laid-Open Patent Application No. 2003-60263). In this magnetoresistive element, the $\Delta RA$ is expected to be increased by generating a spin dependent bulk scattering of the free magnetic layer and a spin dependent interface scattering of the thin insertion layer.

However, in using the materials of the thin insertion layer and the configuration of the spin valve film as shown in Japanese Laid-Open Patent Application No. 2003-60263, the increase of $\Delta RA$ is insufficient.

Furthermore, in obtaining higher recording density, it is difficult to increase $\Delta RA$ while maintaining balance with the low coercive force characteristic of the free magnetic layer. That is, there is a problem where sensitivity of the magnetoresistive element deteriorates as the coercive force of the free magnetic layer increases.

SUMMARY OF THE INVENTION

It is a general object of the present invention to provide a magnetoresistive element, a magnetic head, and a magnetic memory apparatus that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a magnetoresistive element, a magnetic head, and a magnetic memory apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a magnetoresistive element of a CPP type configuration including a fixed magnetic layer, a first non-magnetic layer, a free magnetic layer, and a second non-magnetic layer, the magnetoresistive element including: a first interface layer situated between the free magnetic layer and the first non-magnetic layer; and a second interface layer situated between the free magnetic layer and the second non-magnetic layer; wherein each of the first interface layer and the second interface layer includes a material mainly having CoNiFe.

Furthermore, the present invention provides a magnetoresistive element of a CPP type configuration including a fixed magnetic layer, a first non-magnetic layer, a free magnetic layered body, and a second non-magnetic layer, the magnetoresistive element including: a non-magnetic coupling layer situated between two ferromagnetic layered bodies in the free magnetic layered body; wherein the two ferromagnetic layered bodies are ferromagnetically exchange coupled to each other; wherein each of the ferromagnetic layered bodies includes a first interface magnetic layer, a free magnetic layer, and a second interface magnetic layer; wherein each of the first interface layer and the second interface layer includes a material mainly having CoNiFe.

Furthermore, the present invention provides a magnetoresistive element of a CPP type configuration including a fixed magnetic layer, a first non-magnetic layer, a free magnetic layered body, and a second non-magnetic layer, the magnetoresistive element including: a first interface layer situated between the free magnetic layered body and the first non-magnetic layer; a second interface layer situated between the free magnetic layered body and the second non-magnetic layer; wherein the free magnetic layered body includes a ferromagnetic layer situated between a pair of free magnetic layers; wherein each of the first interface layer and the second interface layer includes a material mainly having CoNiFe.

In the magnetoresistive element according to an embodiment of the present invention, the ferromagnetic layer may include a ferromagnetic material of at least one of Co, Ni, Fe, and an alloy including at least one of Co, Ni, Fe.

In the magnetoresistive element according to an embodiment of the present invention, the ferromagnetic layer may include a material mainly having CoNiFe.

In the magnetoresistive element, the fixed magnetic layer may include a first fixed magnetic layer, a non-magnetic coupling layer, and a second fixed magnetic layer, wherein the first fixed magnetic layer and the second fixed magnetic layer are ferromagnetically exchange coupled to each other.

In the magnetoresistive element according to an embodiment of the present invention, the magnetoresistive element may further include another fixed magnetic layer situated on the second non-magnetic layer.

In the magnetoresistive element according to an embodiment of the present invention, the other fixed magnetic layer may include another first fixed magnetic layer, another non-magnetic coupling layer, and another second fixed magnetic layer, wherein the other first fixed magnetic layer and the other second fixed magnetic layer are ferromagnetically exchange coupled to each other.

In the magnetoresistive element according to an embodiment of the present invention, the film thickness of each of the first interface magnetic layer and the second interface magnetic layer may be no less than 0.5 nm and no more than 2.0 nm.

In the magnetoresistive element according to an embodiment of the present invention, each of the first interface magnetic layer and the second interface magnetic layer may substantially include only CoNiFe, wherein the CoNiFe has a composition falling in an area ABCDA when each component of CoNiFe is indicated with coordinates of (Co content, Ni content, Fe content) in a three dimensional state diagram, wherein the area ABCDA is delineated by connecting a point A (10, 55, 35), a point B (10, 5, 85), a point C (80, 5, 15), a point D (80, 15, 5) and the point A with straight lines, wherein the component value is expressed in atom %.

In the magnetoresistive element according to an embodiment of the present invention, each of the first interface magnetic layer and the second interface magnetic layer may substantially include only CoNiFe, wherein the CoNiFe has a composition falling in an area AEFCDA when each component of CoNiFe is indicated with coordinates of (Co content, Ni content, Fe content) in a three dimensional state diagram, wherein the area AEFCDA is delineated by connecting a point A (10, 55, 35), a point E (10, 27.5, 62.5), a point F (50, 5, 45), a point C (80, 5, 15), a point D (80, 15, 5) and the point A with straight lines, wherein the component value is expressed in atom %.

In the magnetoresistive element according to an embodiment of the present invention, each of the free magnetic layer may include a ferromagnetic material of at least one of Co, Ni, Fe, and an alloy including at least one of Co, Ni, Fe.

In the magnetoresistive element according to an embodiment of the present invention, the free magnetic layer may include a ferromagnetic material mainly having NiFe.

In the magnetoresistive element according to an embodiment of the present invention, the first interface magnetic layer and the second interface magnetic layer may have substantially the same composition.

Furthermore, the present invention provides a magnetoresistive element of a CPP type configuration including an anti-ferromagnetic layer, a fixed magnetic layer, a first non-magnetic layer, a free magnetic layer, and a second non-magnetic layer, the magnetoresistive element including: a first interface layer situated between the free magnetic layer and the first non-magnetic layer; a second interface layer situated between the free magnetic layer and the second non-magnetic layer; wherein each of the first interface layer and the second interface layer includes a material mainly having CoNiFe.

Furthermore, the present invention provides a magnetoresistive element of a CPP type configuration including an anti-ferromagnetic layer, a fixed magnetic layer, a first non-magnetic layer, a free magnetic layer, a second non-magnetic layer, another fixed magnetic layer, and another anti-ferromagnetic layer, the magnetoresistive element including: a first interface layer situated between the free magnetic layer and the first non-magnetic layer; a second interface layer situated between the free magnetic layer and the second non-magnetic layer; wherein each of the first interface layer and the second interface layer includes a material mainly having CoNiFe.

Furthermore, the present invention provides a magnetoresistive element of a CPP type configuration including an anti-ferromagnetic layer, a first fixed magnetic layer, a non-magnetic coupling layer, a second fixed magnetic layer, a first non-magnetic layer, a free magnetic layer, a second non-magnetic layer, another second fixed magnetic layer, another non-magnetic coupling layer, another first fixed magnetic layer, and another anti-ferromagnetic layer, the magnetoresistive element including: a first interface layer situated between the free magnetic layer and the first non-magnetic layer; a second interface layer situated between the free magnetic layer and the second non-magnetic layer; wherein the first interface layer and the second interface layer includes a material mainly having CoNiFe, wherein each of the first fixed magnetic layer and the second fixed magnetic layer are anti-ferromagnetically exchange coupled to each other, and the other first fixed magnetic layer and the other second fixed magnetic layer are anti-ferromagnetically exchange coupled to each other.

Furthermore, the present invention provides a magnetic head including: a recording element; and the magnetoresistive element according to an embodiment of the present invention.

Furthermore, the present invention provides a magnetic memory apparatus including: a magnetic recording medium; and the magnetic head according to an embodiment of the present invention.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings. It is to be noted that "amount of magnetic resistance change per area of a single unit $\Delta RA$" is hereinafter referred to as "magnetic resistance change $\Delta RA$" or simply "$\Delta RA$" (unless defined as otherwise) for the sake of convenience.

First Embodiment

First, a complex type magnetic head including a magnetoresistive element and an induction type recording element according to a first embodiment of the present invention.

Figure 1:
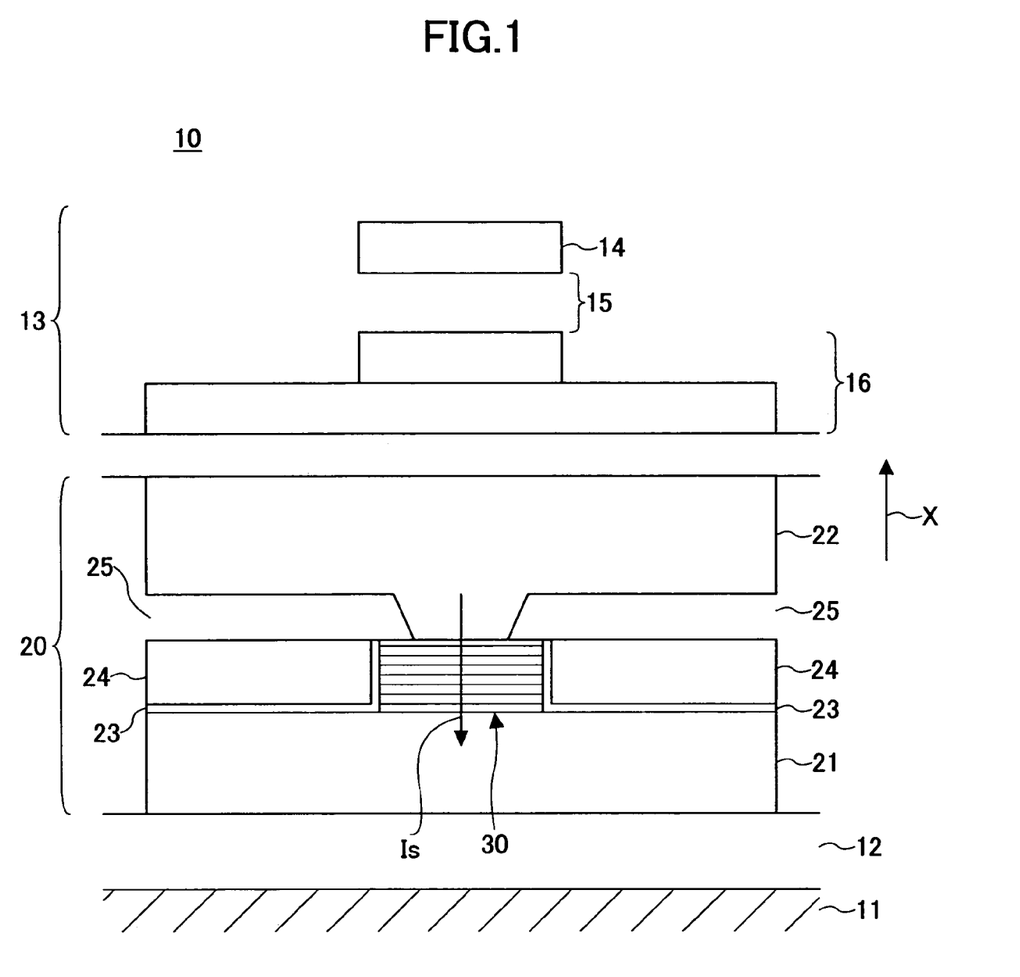
FIG. 1 is a drawing showing a portion of a plane of a complex magnetic head that faces a medium according to a first embodiment of the present invention.

FIG. 1 is a drawing showing a portion of a plane of a complex magnetic head that faces a medium according to a first embodiment of the present invention. The direction of arrow X shown in FIG. 1 indicates the moving direction of a magnetic recording medium.

In FIG. 1, a complex type magnetic head 10 includes, for example, a magnetoresistive element 20 formed on a flat ceramic substrate 11 (formed of, for example, $Al_2O_3$—TiC) serving as a substrate of a head slider, and an induction type recording element 13 formed thereon.

The induction type recording element 13 includes, for example, an upper magnetic pole 14 being situated at its plane facing a magnetic recording medium and being provided with a width that is equivalent to a track width of the magnetic recording medium, a lower magnetic pole 16 facing the upper magnetic pole 16 via a recording gap layer 15 formed of a nonmagnetic material, and a yoke (not shown) for magnetically connecting the upper magnetic pole 14 and the lower magnetic pole 16, a coil (not shown) being wound around the yoke for inducing a recording magnetic field. The upper magnetic pole 14, the lower magnetic pole 16, and the yoke are formed of a soft magnetic material having a large saturation magnetic flux density for securing a recording magnetic field, for example, alloys including $Ni_{80}Fe_{20}$, CoZrNb, FeN, FeSiN, FeCo. It is to be noted that the induction type recording element 13 is not limited to the foregoing structure, but may alternatively employ a known recording element structure.

The magnetoresistive element 20 includes a lower electrode 21, a GMR film 30, an alumina film 25, and an upper electrode 22 layered on an alumina film 12 formed on the surface of the ceramic substrate 11. The upper electrode 22 is disposed contacting the surface of the GMR film 30. Furthermore, magnetic domain control films 24 are disposed on both sides of the GMR film 30 via an insulating film 23. The magnetic domain control film 24 may be formed as, for example, a layered body including a CR film and a ferromagnetic CoCrPt film. The magnetic domain control film 24 serves to divide the fixed magnetic layer and the free magnetic layer in the GMR film 30 (see FIG. 2) into single magnetic domains and prevent the generation of barkhausen noise.

The lower electrode 21 and the upper electrode 22 not only provide a path for passing a sense current Is therethrough, but also provide a function of a magnetic shield. Therefore, the lower electrode 21 and the upper electrode 22 may be formed of, for example, a soft magnetic material such as NiFe or CoFe. Furthermore, the interface between the lower electrode 21 and the GMR film 30 may be formed of, for example, a conductive film such as, a Cu film, a Ta film, or a Ti film.

Furthermore, the magnetoresistive element 20 and the induction type recording element 13 are covered by, for example, an alumina film or a carbon hydride film for preventing problems such as corrosion.

The sense current Is flows through the GMR 30, for example, from the upper electrode 22 to the lower electrode 21 in a manner substantially perpendicular to the surface of the GMR 30. In the GMR film 30, the electric resistance value, or the so-called magnetoresistance value changes in correspondence with the strength and direction of the magnetic field leaking from the magnetic recording medium. The magnetoresistance change of the GMR film 30 is detected as voltage change by the magnetoresistive element 20. Accordingly, the magnetoresistive element 20 reproduces information recording in the magnetic recording medium. It is to be noted that the flow direction of the sense current Is is not limited to the direction illustrated in FIG. 1, but may alternatively flow in an opposite direction. Furthermore, the magnetic recording medium may alternatively move in an opposite direction.

Figure 2:
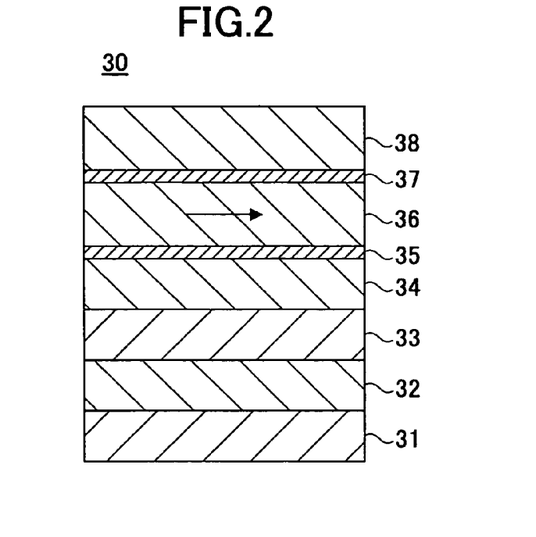
FIG. 2 is a cross-sectional view of a first example of a GMR film in a magnetoresistive element according to a first embodiment of the present invention.

FIG. 2 is a cross-sectional view of a first example of the GMR film 30 in the magnetoresistive element 20 according to a first embodiment of the present invention.

With reference to FIG. 2, the GMR film 30 of the first example has a single spin valve structure. The GMR 30 includes a substrate layer 31, an antiferromagnetic layer 32, a fixed magnetic layer 33, a non-magnetic intermediate layer 34, a first interface magnetic layer 35, a free magnetic layer 36, a second interface magnetic layer 37, and a protective layer 38, which are layered in that order.

The substrate layer 31 is formed on the surface of the lower electrode 21 (shown in FIG. 1) by using, for example, a sputtering method. For example, the substrate layer 31 may be formed as a NiCr film or as a layered configuration including a Ta film (for example, 5 nm film thickness) and a NiFe film (for example, 5 nm film thickness). It is preferable that the Fe contained in the NiFe film falls within a range 17 atom % to 25 atom %. By using the NiFe film having this composition, the antiferromagnetic layer 32 can be epitaxially grown on a (111) crystal plane being the crystal growth orientation of the NiFe film and on the surface of a crystallographically equivalent plane of such plane. Accordingly, the crystallinity of the antiferromagnetic layer 32 can be improved.

The antiferromagnetic layer 32 includes, for example, an Mn-TM alloy (TM includes at least one of Pt, Pd, Ni, Ir) having a film thickness of 5 nm-30 nm (preferably, 10 nm-20 nm). The aniteferromagnetic layer 32 is fabricated as an ordered alloy and is provided with an antiferromagnetic property by performing a heating process (described below) on the antiferromagnetic layer 32. The antiferromagnetic layer 32 serves to create an exchange interaction with the fixed magnetic layer 33 and fixes the magnetization of the fixed magnetic layer 33 to a predetermined direction.

The fixed magnetic layer 33 has a film thickness of, for example, 1 nm-30 nm. The fixed magnetic layer 33 is formed of a ferromagnetic material including, for example, Co, Ni, Fe, or those including these elements. As a preferable ferromagnetic material for the fixed magnetic layer 33, there is, for example, CoFe, CoFeB, NiFe, and FeCoCu. It is to be noted that the fixed magnetic layer 33 is not limited to a single layer configuration, but may alternatively be a layered configuration having two layers or more. The respective layers of the layered configuration may employ combinations of materials that are of the same element but with different compositional proportion or combinations of materials that are of different elements.

Furthermore, a ferromagnetic junction layer (not shown), which is formed of a ferromagnetic material having a saturation magnetic flux density higher than that of the fixed magnetic layer 33, may be provided between the fixed magnetic layer 33 and the antiferromagnetic layer 32. By providing the ferromagnetic junction layer, the exchange interaction between the fixed magnetic layer 33 and the antiferromagnetic layer 32 can be increased and problems such as displacement or inversion in the direction of magnetization of the fixed magnetic layer 33 can be prevented.

The non-magnetic intermediate layer 34 has a film thickess of, for example, 1.5 nm-30 nm. The non-magnetic intermediate layer 34 is formed of a non-magnetic conductive material (preferably, for example, Cu, Al).

The first interface magnetic layer 35 and the second interface magnetic layer 37 are formed of a ferromagnetic material having CoNiFe as a main constituent. The first interface magnetic layer 35 and the second interface magnetic layer 37 may be formed only with CoNiFe, or may be formed with CoNiFe added with, for example, V and/or B.

Furthermore, the first interface magnetic layer 35 and the second interface magnetic layer 37 are set with a film thickness, preferably ranging between 0.5 nm-2.0 nm. Although a large film thickness is preferred for the first interface magnetic layer 35 and the second interface magnetic layer 37 so as to increase spin dependent bulk scattering, a film thickness exceeding 2.0 nm will increase coercive force of the first interface magnetic layer 35 and the second interface magnetic layer 37, and thus result in increase of the entire layered configuration with respect to the free magnetic layer 36.

Furthermore, the first interface magnetic layer 35 and the second interface magnetic layer 37 may employ combinations of materials that are of the same element but with different compositional proportion or combinations of materials that are of different elements.

Figure 3:
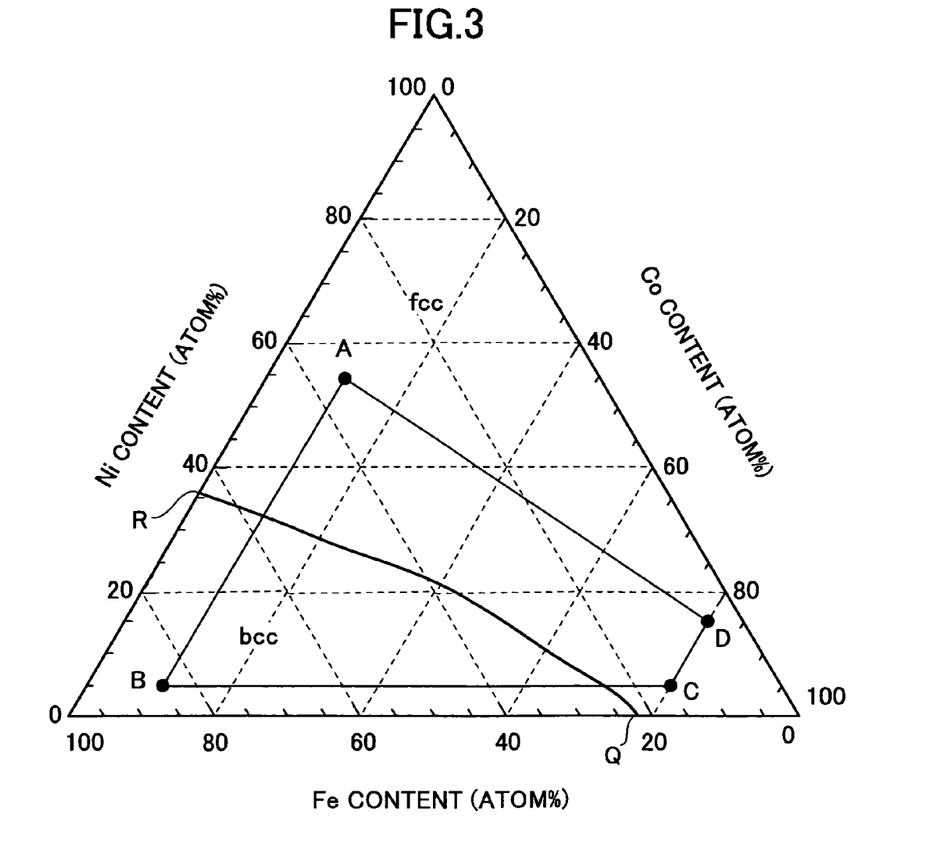
FIG. 3 is a diagram for explaining a composition of CoNiFe in a first interface magnetic layer and a second interface magnetic layer.

FIG. 3 is a diagram for explaining a composition of CoNiFe in the first interface magnetic layer 35 and the second interface magnetic layer 37. FIG. 3 is a ternary diagram (triangle coordinate) that indicates the Co, Ni, Fe content (atom %) using the three sides of a triangle.

With reference to FIGS. 2 and 3, whether the structure of CoNiFe is a body-centered cubic structure (bcc structure) or a face-centered cubic structure (fcc structure) depends on the composition of CoNiFe. The boundary line QR of the bcc structure and the fcc structure is a curved line (a substantially straight line) connecting point Q (77,0,23) situated toward the CoFe side and point R (0,35,65) situated toward the NiFe side. The CoNiFe structure is the fcc structure when the Ni content is higher or when the Fe content is lower with respect to the boundary line QR. The CoNiFe structure is the bcc structure when the Ni content is lower or when the Fe content is higher with respect to the boundary line QR. The isothermal diagram of CoNiFe under room temperature is extracted from Osaka et al (Nature Vol. 392, 1998, pp. 796-798). This isothermal diagram illustrates a CoNiFe film that is fabricated with an electroplating method. Nevertheless, since it is assumed that the boundary line QR will be situated in a same manner with respect to a substantially same composition, a CoNiFe film that is fabricated with a sputtering method is described by using the isothermal diagram of FIG. 3.

The first interface magnetic layer 35 and the second interface magnetic layer 37 is preferred to have a composition ranging within the area ABCDA shown in FIG. 3. The area ABCDA is an area delineated by connecting point A (10,55,35), point B (10,5,85), point C (80,5,15), and point D (80,15,5) with straight lines in an order of point A, B, C, D and A. The area ABCDA substantially includes the boundary line QR of the bcc structure and the fcc structure.

It is found by the inventors of the present invention that the magnetoresistance change $\varDelta RA$ increases when a CoNiFe film having a composition in the proximity of the boundary line QR of the fcc structure and the bcc structure is applied to the first interface magnetic layer 35 and the second interface magnetic layer 37. The inventors of the present invention found that large magnetoresistance change $\varDelta RA$ can be obtained with a composition falling within the area ABCDA in a case where CoNiFe film is used for the first interface magnetic layers 35 and the second interface magnetic layer 37 and the GMR film configuration of the first example is used. Inside the area ABCDA, a composition having low Ni content (toward side BC) shows a higher magnetoresistance change $\varDelta RA$ when compared to a composition having high Ni content (toward side AD). It is assumed that spin dependent bulk scattering is larger with a CoNiFe film having a bcc crystal structure rather than a CoNiFe film having an fcc crystal structure. It is to be noted that there is a decrease in both spin dependent bulk scattering and spin dependent interface scattering decrease in a case of a composition having an Ni content higher than the side AD of the area ABCDA.

Furthermore, the inventors of the present invention found that a low coercive force can be maintained for the layered configuration including the first interface magnetic layer 35, the free magnetic layer 36, and the second interface magnetic layer 37 in a case where a thin CoNiFe film is used for the first interface magnetic layer 35 and the second interface magnetic layer 37. The CoNiFe film shows that coercive force tends to be high with a composition having a low Ni content (toward side BC) rather than a composition having a high Ni content (toward side AD). In a case where a CoNiFe film is used for the first interface magnetic layer 35 and the second interface magnetic layer 37, the coercive force of the CoNiFe film depends on the film thickness of each of the first and second interface magnetic layers 35, 37. The coercive force decreases as the layers become thinner. Therefore, with a composition having low Ni content, a layered configuration maintaining a low coercive force can be obtained by providing the first interface magnetic layer 35 and the second interface magnetic layer 37 with a film thickness of, for example, 0.5 nm. The respective layers of the layered configuration may employ combinations of materials that are of the same element but with different compositional proportion or combinations of materials that are of different elements.

The free magnetic layer 36 is provided on the surface of the first interface magnetic layer 35. The free magnetic layer 36 has a film thickness of 1 nm-30 nm and is formed of a ferromagnetic material including, for example, Co, Ni, Fe, or those including these elements. For example, the free magnetic layer 36 may be a NiFe film, a FeCo film, a FeCoB film or a layered configuration including these films.

Since the layered configuration including the first interface magnetic layer 35 and the second interface magnetic layer 37 is able to attain a low coercive force, it is preferable to use a NiFe film for the free magnetic layer 36. Furthermore, in a case of using a NiFe film for the free magnetic layer 36 and using a Cu film for the non-magnetic intermediate layer 34 and/or the protective layer 38, it becomes easier for Cu to diffuse to the NiFe film. As a result, a solid solution is formed at the interface between the NiFe film and the Cu film(s). The formation of the solid solution causes problems such as decrease in both spin dependent interface scattering at the interface and spin dependent bulk scattering at the NiFe film. By providing the first interface magnetic layer 35 and/or the second interface magnetic layer 37 between the NiFe film and the Cu film (non-magnetic intermediate layer 34 and/or the protective layer 38), Cu can be prevented from diffusing to the NiFe film and the magnetoresistance change $\varDelta$RA can be prevented from decreasing.

The protective layer 38 is formed of a non-magnetic conductive material. For example, the protective layer 38 may be metal film including any one of the materials such as Ru, Cu, Ta, Au, Al or W. The protective layer is not limited to a single layer configuration, but may alternatively be a layered configuration. In a case of using the layered configuration, it is preferable to provide a Cu film or an Al film at the side toward the second interface magnetic layer 37. By doing so, the spin dependent interface scattering between the second interface magnetic layer 37 and the protective layer 38 can be increased.

Furthermore, the protective layer 38 is formed by using, for example, a sputtering method. The protective layer 38 is able to protect the second interface magnetic layer 37 and the free magnetic layer 36 from oxidation during a heating process for obtaining an antiferromagnetic property in the antiferromagnetic layer 32.

Next, a method of forming the first example of the GMR film 30 is described. First, each of the layers of the GMR film 30 (from the substrate layer 31 to the protective layer 38) are formed by executing, for example, a sputtering method, a vapor deposition method, or a CVD method with use of the above-described materials. Then, the resultant layered configuration is subject to a heating process (thermal process) in a magnetic field. The heating process is performed in a vacuum atmosphere under conditions where, for example, the heating temperature is 250° C.-280° C., the heating time is approximately 3 hours, and the applied magnetic field is 1592 kA/m. By performing the heating process, the Mn-TM alloy of the antiferromagnetic layer 32 is fabricated as an ordered alloy having an antiferromagnetic property. Furthermore, by applying a magnetic field to the layered configuration in a predetermined direction, the direction of the magnetization of the fixed magnetic layer can be fixed to a predetermined direction owing to an exchange interaction between the antiferromagnetic layer 32 and the fixed magnetic layer 33. Then, the layered configuration of the GMR film 30 is patterned into a predetermined shape as shown in FIG. 1. Thereby, the formation of the GMR film 30 is completed. It is to be noted that the following examples (second example-seventh example) of the GMR film (40, 45, 50, 60, 70, 80) is formed substantially in the same manner as the above-described first example of the GMR film 30.

By providing the first interface magnetic layer 35 and the second interface magnetic layer 37 including CoNiFe as their main component and interposing the free magnetic layer 36 therebetween, the magnetoresistance change $\varDelta$RA of the first example of the GMR film 30 can be increased and the layered configuration including the first interface magnetic layer 35, the free magnetic layer 36, and the second interface magnetic layer 37 can maintain a low coercive force. Particularly, by providing a thin film and/or a CoNiFe composition to the first interface magnetic layer 35 and the second interface magnetic layer 37, the coercive force of the layered configuration including the first interface magnetic layer 35, the free magnetic layer 36, and the second interface magnetic layer 37 can be lowered. Accordingly, a magnetoresistive element having large magnetoresistance change $\varDelta$RA and excellent sensitivity can be obtained. It is to be noted that the below-described second example of the GMR film 40 may be used as an alternative for the first example of the GMR film 30.

Figure 4:
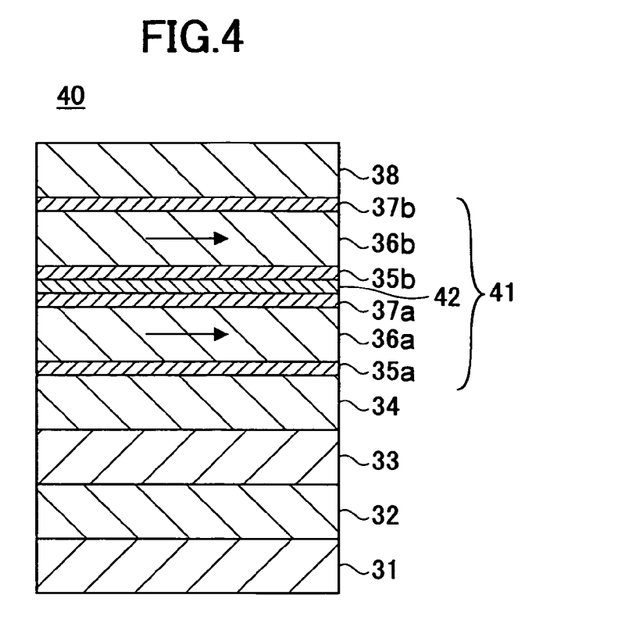
FIG. 4 is a cross-sectional view of a second example of a GMR film in a magnetoresistive element according to a first embodiment of the present invention.

FIG. 4 is a cross-sectional view of the second example of the GMR film 40 in a magnetoresistive element according to a first embodiment of the present invention. The second example of the GMR film 40 is a modified example of the first example of the GMR film 30. In FIG. 4, like components are denoted with like numerals as of the above-described drawings and are not further explained.

With reference to FIG. 4, the GMR film 40 of the second example has a single spin valve structure. The GMR 40 includes a substrate layer 31, an antiferromagnetic layer 32, a fixed magnetic layer 33, a non-magnetic intermediate layer 34, a free magnetic layered configuration 41, and a protective layer 38, which are layered in that order. The free magnetic layered configuration 41, beginning from the side toward the non-magnetic intermediate layer 34, is layered with a first interface magnetic layer 35a, a free magnetic layer 36a, a second interface magnetic layer 37a, a non-magnetic coupling layer 42, a first interface magnetic layer 35b, a free magnetic layer 36b, and a second interface magnetic layer 37b, which are layered in that order. In the GMR film 40, the layered configuration including the first interface magnetic layer 35a, the free magnetic layer 36a, the second interface magnetic layer 37a and the layered configuration including the first interface magnetic layer 35b, the free magnetic layer 36b, and the second interface magnetic layer 37b are in a ferromagnetically exchange coupled state via the non-magnetic coupling layer 42. The GMR film 40 is substantially configured in the same manner as the first example of the GMR film 30 except for the free magnetic layered configuration 41.

The materials used for the first interface magnetic layer 35 and the second interface magnetic layer 37 shown in FIG. 2 can also be used for the first interface magnetic layers 35a, 35b and the second interface magnetic layers 37a, 37b, and the film thicknesses of the first interface magnetic layer 35 and the second interface magnetic layer 37 shown in FIG. 2 can also be applied to the first interface magnetic layers 35a, 35b and the second interface magnetic layers 37a, 37b. Furthermore, the material used for the free magnetic layer 36 shown in FIG. 2 can also be used for the free magnetic layers 36a, 36b, and the film thickness of the free magnetic layer 36 can also be applied to the free magnetic layers 36a, 36b. The first interface magnetic layers 35a, 35b and the second interface magnetic layers 36a, 36b are set with film thicknesses ranging, preferably, from 0.5 nm to 2.0 nm. From the aspect of further lowering the coercive force of the free magnetic layered configuration 41, it is more preferable for the first interface magnetic layers 35a, 35b and the second interface magnetic layers 37a, 37b to be set with film thicknesses ranging from 0.5 nm to 1.0 nm.

The non-magnetic coupling layer 42 is set with a film thickness that will enable ferromagnetic connection between the magnetization of the layered configuration including the first interface magnetic layer 35a, the free magnetic layer 36a, and the second interface magnetic layer 37a and the magnetization of the layered configuration including the first interface magnetic layer 35b, the free magnetic layer 36b, and the second interface magnetic layer 37b. The film thickness of the non-magnetic coupling layer 42 is selected from a range from, for example, 0.2 nm to 0.5 nm. The non-magnetic coupling layer 42 includes a non-magnetic material, for example, Ru, Rh, Ir, Ru family alloy, Rh family alloy, or Ir family alloy.

It is preferable for the entire film thickness of the free magnetic layered configuration 41 to be set no more than 8 nm. In a case where the film thickness of the free magnetic layered configuration 41 exceeds 8 nm, the entire thickness of the GMR film 40 will increase and the read gap length will excessively increase.

In comparison with the first example of the GMR film 30, the second example of the GMR film 40 is further provided with an interface of a ferromagnetic layer/non-magnetic layer between the second interface magnetic layer 37a and the non-magnetic coupling layer 42 and also between the first interface magnetic layer 35b and the non-magnetic coupling layer 42. Accordingly, since the spin dependent interface scattering increases along with the increase of interfaces, the second example of the GMR film 40 can obtain a greater magnetoresistance change $\Delta$RA than that of the first example of the GMR film 30.

Furthermore, since the film thickness of each of the first interface magnetic layer 35a, 35b and the second interface magnetic layer 37a, 37b can be reduced by providing the first interface magnetic layer 35a, 35b and the second interface magnetic layer 37a, 37b with a total film thickness that is substantially the same as the film thickness of the first example of the GMR film 30, the coercive force of each of the layers can be reduced. As a result, a lower coercive force can be obtained for the free magnetic layered configuration 41 compared to that of the layered configuration of the first example of the GMR film 30 including the first interface magnetic layer 35, the free magnetic layer 36, and the second interface magnetic layer 37.

Therefore, the second example of the GMR film 40 not only can attain the same effects as those of the first example of the GMR film 30 but can also obtain a greater magnetoresistance change $\Delta$RA than that of the first example of the GMR film 30. Furthermore, the coercive force of the free magnetic layered configuration 41 can be lower than that of the first example of the GMR film 30. As a result, an excellent magnetoresistive element having greater magnetoresistance change $\Delta$RA and higher sensitivity can be obtained.

Figure 5:
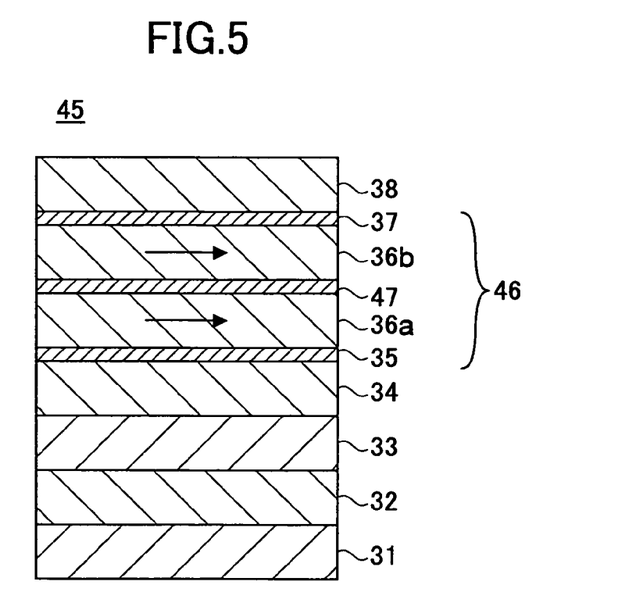
FIG. 5 is a cross-sectional view of a third example of a GMR film in a magnetoresistive element according to a first embodiment of the present invention.

It is to be noted that the free magnetic layered configuration 41 is not limited to having two layered configurations where each layered configuration includes the first interface magnetic layer, the free magnetic layer, and the second interface magnetic layer. Alternatively, the free magnetic layered configuration 41 may have three or more layered configurations. The number of the layered configurations is, however, preferred to be a number so that the thicknesses of the layers do not surpass the above-described ranges of film thickness. It is to be noted that the following third example of the GMR film 45 may be used for the magnetoresistive element as an alternative of the second example of the GMR film 40.

FIG. 5 is a cross-sectional view of the third example of the GMR film 45 in a magnetoresistive element according to a first embodiment of the present invention. The third example of the GMR film 45 is a modified example of the first example of the GMR film 30. In FIG. 5, like components are denoted with like numerals as of the above-described drawings and are not further explained.

With reference to FIG. 5, the GMR film 45 of the third example has a single spin valve structure. The GMR 45 includes a substrate layer 31, an antiferromagnetic layer 32, a fixed magnetic layer 33, a non-magnetic intermediate layer 34, a free magnetic layered configuration 46, and a protective layer 38, which are layered in order. The free magnetic layered configuration 46, beginning from the side toward the non-magnetic intermediate layer 34, is layered with a first interface magnetic layer 35, a free magnetic layer 36a, a ferromagnetic junction layer 47, a free magnetic layer 36b, and a second interface magnetic layer 37 in that order. In the free magnetic layered configuration 46, the free magnetic layer 36a and the free magnetic layer 36b are in a ferromagnetically exchange coupled state via the ferromagnetic junction layer 47. The GMR film 45 is substantially configured in the same manner as the first example of the GMR film 30 except for the free magnetic layered configuration 46.

The ferromagnetic junction layer 47 is formed of a ferromagnetic material including at least one of Co, Ni, Fe, or an alloy of these materials. For example, CoFe, CoFeB, CoNiFe are preferred ferromagnetic materials for the ferromagnetic junction layer 47 from the aspect of obtaining large spin dependent bulk scattering. Thereby, the magnetoresistance change $\Delta$RA can be increased.

A ferromagnetic material mainly composed of CoNiFe is preferred to be used for the ferromagnetic junction layer 47 and is preferred to have a composition which is the same as that of the first interface magnetic layer 35 and the second interface magnetic layer 37. Thereby, the magnetoresistance change $\Delta$RA can be further increased.

The ferromagnetic junction layer 47 is preferred to have a film thickness, for example, ranging from 0.5 nm to 2.0 nm. Particularly, in a case where the ferromagnetic junction layer 47 is formed of CoNiFe, the ferromagnetic junction layer 47 is preferred to have a film thickness ranging from 0.5 nm to 1.0 nm. Thereby, the free magnetic layered configuration 46 is able to maintain a low coercive force.

With the third example of the GMR film 45, the spin dependent bulk scattering can be increased by further providing the ferromagnetic junction layer 47. Furthermore, by using the CoNiFe film for the ferromagnetic junction layer 47, the film thicknesses of the first interface magnetic layer 35 and the second interface magnetic layer 37 can be reduced without decrease of magnetoresistance change $\Delta$RA. Accordingly, the free magnetic layered configuration 46 can obtain a coercive force lower than that of the first example of the GMR film 30. In addition, the number of layers of the ferromagnetic junction layer 47 and the free magnetic layers 36a, 36b may be increased. This allows the magnetoresistance change $\varDelta$RA to be further increased. As a result, an excellent magnetoresistive element having greater magnetoresistance change $\varDelta$RA and higher sensitivity can be obtained. It is to be noted that the following fourth example of the GMR film 50 may be used for the magnetoresistive element as an alternative of the third example of the GMR film 45.

Figure 6:
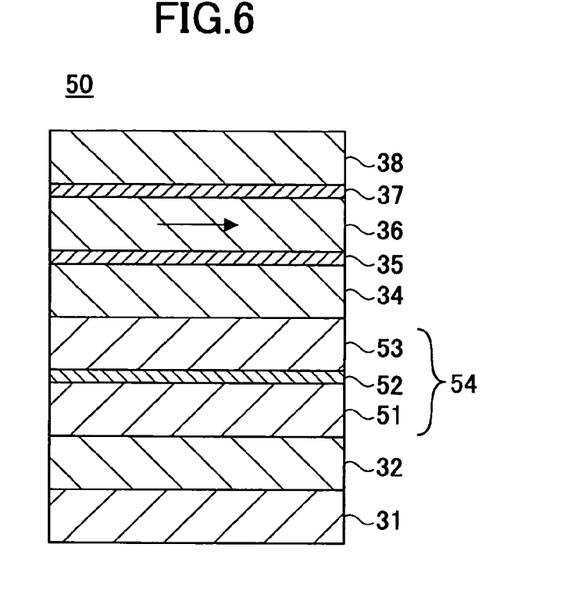
FIG. 6 is a cross-sectional view of a fourth example of a GMR film in a magnetoresistive element according to a first embodiment of the present invention.

FIG. 6 is a cross-sectional view of the fourth example of the GMR film 50 in a magnetoresistive element according to a first embodiment of the present invention. The fourth example of the GMR film 50 is a modified example of the first example of the GMR film 30. In FIG. 6, like components are denoted with like numerals as of the above-described drawings and are not further explained.

With reference to FIG. 6, the GMR film 50 of the fourth example has a single spin valve structure. The GMR 50 includes a substrate layer 31, an antiferromagnetic layer 32, a fixed magnetic layered configuration 54, a non-magnetic intermediate layer 34, a first interface magnetic layer 35, a free magnetic layer 36, a second interface magnetic layer 37 and a protective layer 38, which are layered in that order. The fixed magnetic layered configuration 54, beginning from the side toward the anti-ferromagnetic layer 32, is layered with a first fixed magnetic layer 51, a non-magnetic coupling layer 52, and a second fixed magnetic layer 53, which are layered in that order. In the fixed magnetic layered configuration 54, the first fixed magnetic layer 51 and the second fixed magnetic layer 53 are in an anti-ferromagnetically exchange coupled state via the non-magnetic coupling layer 52. That is, the fixed magnetic layered configuration 54 has a so-called layered ferri-structure. The GMR film 50 is substantially configured in the same manner as the first example of the GMR film 30 except for the fixed magnetic layered configuration 46.

The material used for the fixed magnetic layer 33 shown in FIG. 2 can also be used for the first fixed magnetic layer 51 and the second fixed magnetic layer 53 and the film thicknesses of the fixed magnetic layer 33 shown in FIG. 2 can also be applied to the first fixed magnetic layer 51 and the second fixed magnetic layer 53.

Furthermore, the film thickness of the non-magnetic coupling layer 52 is set in a range for enabling anti-ferromagnetic coupling between the first fixed magnetic layer 51 and the second fixed magnetic layer 53. The range is from 0.4 nm to 1.5 nm (preferably, from 0.4 nm to 0.9 nm). The non-magnetic coupling layer 52 is formed of a non-magnetic material including, for example, Ru, Rh, Ir, Ru family alloy, Rh family alloy, or Ir family alloy. A non-magnetic material having Ru and any one of Co, Cr, Fe, Ni, and Mn or an alloy thereof is a preferable example of the Ru family alloy.

Since the magnetization between the first fixed magnetic layer 51 and the second fixed magnetic layer 53 is anti-parallel, the net magnetic field strength of the leakage magnetic field leaking from the first fixed magnetic layer 51 and the second fixed magnetic layer 53 decreases. This prevents the magnetization direction of the free magnetic layer 36 from being adversely affected such as being displaced by the leakage magnetic field. Accordingly, since the magnetization of the free magnetic layer 36 precisely reacts to the leakage magnetic field from the magnetic recording medium, the sensitivity and S/N ratio for the magnetoresistive element.

The fourth example of the GMR film 50 not only attains the same effects as the first example of the GMR film 30 but also has a fixed magnetic layered configuration 54 having a layered ferri-structure. Therefore, a satisfactory magnetoresistive element having greater sensitivity and S/N ratio can be obtained. It is to be noted that the following fifth example of the GMR film 60 may be used for the magnetoresistive element as an alternative of the fourth example of the GMR film 50.

Figure 7:
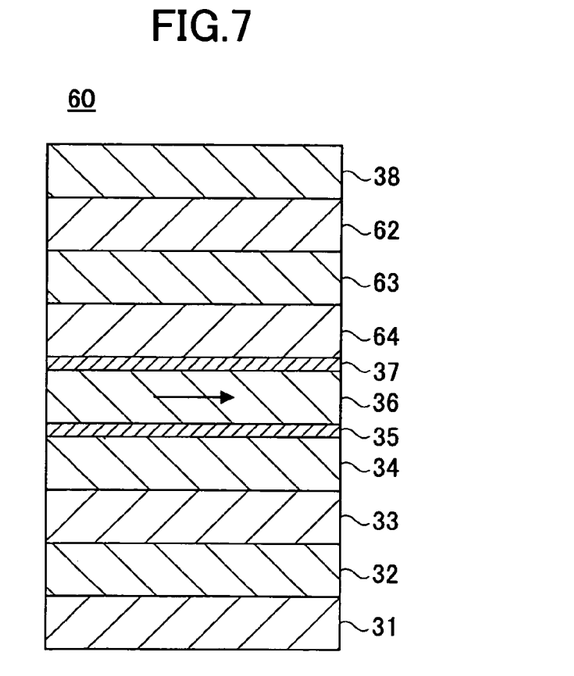
FIG. 7 is a cross-sectional view of a fifth example of a GMR film in a magnetoresistive element according to a first embodiment of the present invention.

FIG. 7 is a cross-sectional view of the fifth example of the GMR film 60 in a magnetoresistive element according to a first embodiment of the present invention. The fifth example of the GMR film 60 is a modified example of the first example of the GMR film 30. In FIG. 7, like components are denoted with like numerals as of the above-described drawings and are not further explained.

With reference to FIG. 7, the fifth example of the GMR film 60 includes a substrate layer 31, a lower fixed magnetic layer 33, a lower non-magnetic intermediate layer 34, a first interface magnetic layer 35, a free magnetic layer 36, a second interface magnetic layer 37, an upper non-magnetic intermediate layer 64, an upper fixed magnetic layer 63, an upper anti-ferromagnetic layer 62, and a protective layer 38, which are layered in that order. That is, the GMR film 70 has a configuration where the upper non-magnetic intermediate layer 64, the upper fixed magnetic layer 63, and the upper anti-ferromagnetic layer 62 are provided on the free magnetic layer 36 of the first example of the GMR film 30 shown in FIG. 2. The materials used for the lower non-magnetic intermediate layer 34, the lower fixed magnetic layer 33, and the lower anti-ferromagnetic layer 32 can also be used for the upper non-magnetic intermediate layer 64, the upper fixed magnetic layer 63, and the upper anti-ferromagnetic layer 62, and the film thicknesses of the lower non-magnetic intermediate layer 34, the lower fixed magnetic layer 33, and the lower anti-ferromagnetic layer 32 can also be applied to the upper non-magnetic intermediate layer 64, the upper fixed magnetic layer 63, and the upper anti-ferromagnetic layer 62. It is to be noted that since the materials and film thicknesses of the lower non-magnetic intermediate layer 34, the lower fixed magnetic layer 33, and the lower anti-ferromagnetic layer 32 are the same as those of the non-magnetic intermediate layer 34, the fixed magnetic layer 33, and the anti-ferromagnetic layer 32 of the first example of the GMR film 30 (shown in FIG. 2), the lower non-magnetic intermediate layer 34, the lower fixed magnetic layer 33, and the lower anti-ferromagnetic layer 32 are denoted with the same numerals as of the non-magnetic intermediate layer 34, the fixed magnetic layer 33, and the anti-ferromagnetic layer 32 of the first example of the GMR film 30.

The GMR film 70 has a dual spin valve structure including a spin valve structure including the lower fixed magnetic layer 33, the lower non-magnetic intermediate layer 34, the first interface magnetic layer 35, the free magnetic layer 36, and the second interface magnetic layer 37 and another spin valve structure including another first interface magnetic layer 35, another free magnetic layer 36, another second interface magnetic layer 37, the upper non-magnetic intermediate layer 64, and the upper fixed magnetic layer 63. Accordingly, the magnetoresistance change $\varDelta$RA can be increased to approximately twice the amount of the magnetoresistance change $\varDelta$RA of the first example of the GMR film 30.

Furthermore, by forming the free magnetic layer 36 with a NiFe film and the upper non-magnetic intermediate layer 64 with a Cu film, the second interface magnetic layer 37 can prevent the Cu generated from the contact between the free magnetic layer 36 and the upper non-magnetic intermediate layer 64 from diffusing to the NiFe film, and thereby prevent formation of a solid solution. Accordingly, the second interface magnetic layer 37 prevents decrease or rather increases the spin dependent interface scattering between the free magnetic layer 36 and the upper non-magnetic intermediate layer 64.

By providing the dual spin valve structure, the fifth example of the GMR film 60 not only can attain the same effects as those of the first example of the GMR film 30 but also can substantially double the amount of magneto resistance change $\Delta$RA. Therefore, a magnetoresistive element having a greater amount of magnetoresistance change $\Delta$RA can be obtained. It is to be noted that the following sixth example of the GMR film 70 may be used for the magnetoresistive element as an alternative of the fifth example of the GMR film 60.

Figure 8:
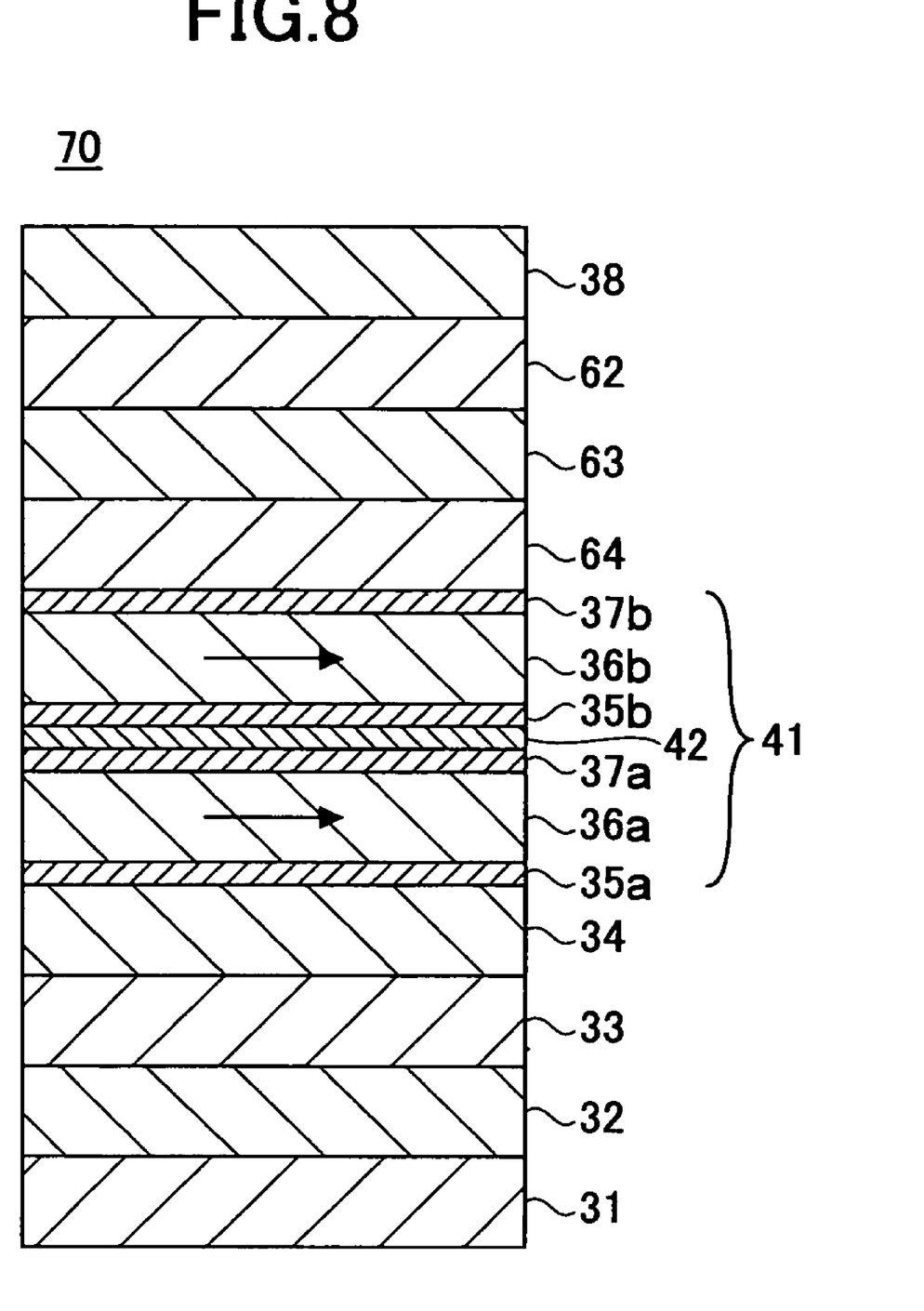
FIG. 8 is a cross-sectional view of a sixth example of a GMR film in a magnetoresistive element according to a first embodiment of the present invention.

FIG. 8 is a cross-sectional view of the sixth example of the GMR film 70 in a magnetoresistive element according to a first embodiment of the present invention. The sixth example of the GMR film 70 is a modified example of the first example of the GMR film 30. In FIG. 8, like components are denoted with like numerals as of the above-described drawings and are not further explained.

With reference to FIG. 8, the sixth example of the GMR film 70 includes a substrate layer 31, a lower anti-ferromagnetic layer 32, a lower fixed magnetic layer 33, a lower non-magnetic intermediate layer 34, a free magnetic layered configuration 41, an upper non-magnetic intermediate layer 64, an upper fixed magnetic layer 63, an upper anti-ferromagnetic layer 62, and a protective layer 38, which are layered in that order. The free magnetic layered configuration 41 has a same configuration as the free magnetic layered configuration 41 in the second example of GMR film 40 shown in FIG. 4. That is, the free magnetic layered configuration 41, beginning from the side toward the non-magnetic intermediate layer 34, is layered with a first interface magnetic layer 35a, a free magnetic layer 36a, a second interface magnetic layer 37a, a non-magnetic coupling layer 42, a first interface magnetic layer 35b, a free magnetic layer 36b, and a second interface magnetic layer 37b, which are layered in that order. That is, in the GMR film 70, the free magnetic layered configuration 41 of the second example is applied to the GMR film 60 of the fifth embodiment.

Accordingly, the sixth example of the GMR film 70 is able to attain the effects attained in the fifth example of the GMR film 60 as well as those attained in the second example of the GMR film 40. That is, the sixth example of the GMR film 70 is able to obtain an increased spin dependent interface scattering and provide a low coercive force for the free magnetic layered configuration 41. As a result, a satisfactory magnetoresistive element having a greater magnetoresistance change $\Delta$RA and a higher sensitivity can be obtained. It is to be noted that the following seventh example of the GMR film 80 may be used for the magnetoresistive element as an alternative of the sixth example of the GMR film 70.

Figure 9:
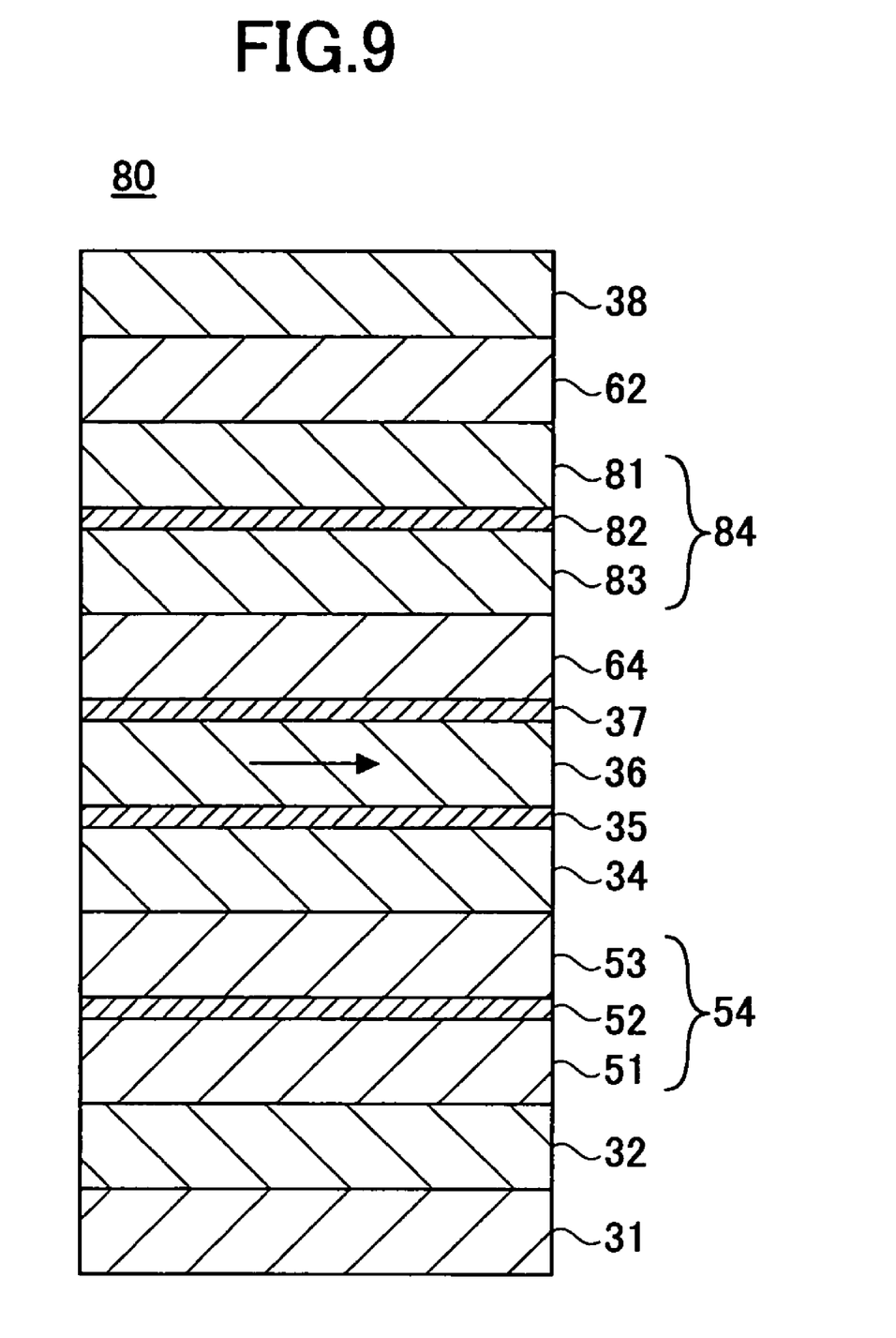
FIG. 9 is a cross-sectional view of a seventh example of a GMR film in a magnetoresistive element according to a first embodiment of the present invention.

FIG. 9 is a cross-sectional view of the seventh example of the GMR film 80 in a magnetoresistive element according to a first embodiment of the present invention. The seventh example of the GMR film 80 is a modified example of the first example of the GMR film 30. In FIG. 9, like components are denoted with like numerals as of the above-described drawings and are not further explained.

With reference to FIG. 9, the seventh example of the GMR film 80 includes a substrate layer 31, a lower anti-ferromagnetic layer 32, a lower fixed magnetic layered configuration 54, a lower non-magnetic intermediate layer 34, a first interface magnetic layer 35, a free magnetic layer 36, a second interface magnetic layer 37, an upper non-magnetic intermediate layer 64, an upper fixed magnetic layered configuration 84, an upper anti-ferromagnetic layer 62, and a protective layer 38, which are layered in that order.

The lower fixed magnetic layered configuration 54, beginning from the side toward the anti-ferromagnetic layer 32, is layered with a lower first fixed magnetic layer 51, a lower non-magnetic coupling layer 52, and a lower second fixed magnetic layer 53, which are layered in that order to form a layered ferri-structure. The upper fixed magnetic layered configuration 84, beginning from the side toward the upper non-magnetic intermediate layer 64, is layered with an upper second fixed magnetic layer 83, an upper non-magnetic layered configuration 82, and an upper first fixed magnetic layer 81, which are layered in that order to form a layered ferri-structure. The GMR film 80 is substantially configured in the same manner as the fifth example of the GMR film 60 except for alternatively using the lower fixed magnetic layered configuration 54 and the upper fixed magnetic layered configuration 84 instead of the lower fixed magnetic layer 33 and the upper fixed magnetic layer 63, respectively.

The material used for the lower first fixed magnetic layer 51, the lower non-magnetic coupling layer 52, and the lower second fixed magnetic layer 53 can be used for the upper first fixed magnetic layer 81, the upper non-magnetic coupling layer 82, and the upper second fixed magnetic layer 83, and the film thicknesses of the lower first fixed magnetic layer 51, the lower non-magnetic coupling layer 52, and the lower second fixed magnetic layer 53 can also be applied to the upper first fixed magnetic layer 81, the upper non-magnetic coupling layer 82, and the upper second fixed magnetic layer 83. It is to be noted that since the materials and film thicknesses of the lower first fixed magnetic layer 51, the lower non-magnetic coupling layer 52, and the lower second fixed magnetic layer 53 are the same as those of the first fixed magnetic layer 51, the non-magnetic coupling layer 52, and the second fixed magnetic layer 53 of the fourth example of the GMR film 50 shown in FIG. 6, the lower first fixed magnetic layer 51, the lower non-magnetic coupling layer 52, and the lower second fixed magnetic layer 53 are denoted with the same numerals as of the the first fixed magnetic layer 51, the non-magnetic coupling layer 52, and the second fixed magnetic layer 53 of the fourth example of the GMR film 50.

Thus structured, the seventh example of the GMR film 80 can attain the same effects attained in the fifth example of the GMR film 60. Furthermore, the seventh example of the GMR film 80 can attain the same effects attained in the fourth example of the GMR film 50 since the lower fixed magnetic layered configuration 54 and the upper fixed magnetic layered configuration 84 are configured as the layered ferri-structure. That is, the leakage magnetic field strength leaking from the upper and lower fixed magnetic layered configurations 54, 84 can be reduced and adverse effects to the free magnetic layer 36 can be prevented. Accordingly, a satisfactory magnetoresistive element having greater magnetoresistance change $\Delta$RA and higher sensitivity can be obtained.

It is to be noted that a ferromagnetic junction layer (not shown) may be disposed, for example, between the lower anti-ferromagnetic layer 32 and the lower fixed magnetic layered configuration 54 and/or between the upper fixed magnetic layered configuration 84 and the upper anti-ferromagnetic layer 62. Next, an example of fabricating the magnetoresistive element having the GMR film according to an embodiment of the present invention is described.

In this example, the magnetoresistive element having the GMR film of the seventh example is described. The GMR films of the first to seventh examples are fabricated by providing the first interface magnetic layer and the second interface magnetic layer with CoNiFe of different compositions (See the table shown in FIG. 10). Each layer of the magntoresistive element, beginning from the side toward the substrate, is fabricated in the following manner.

Figure 10:
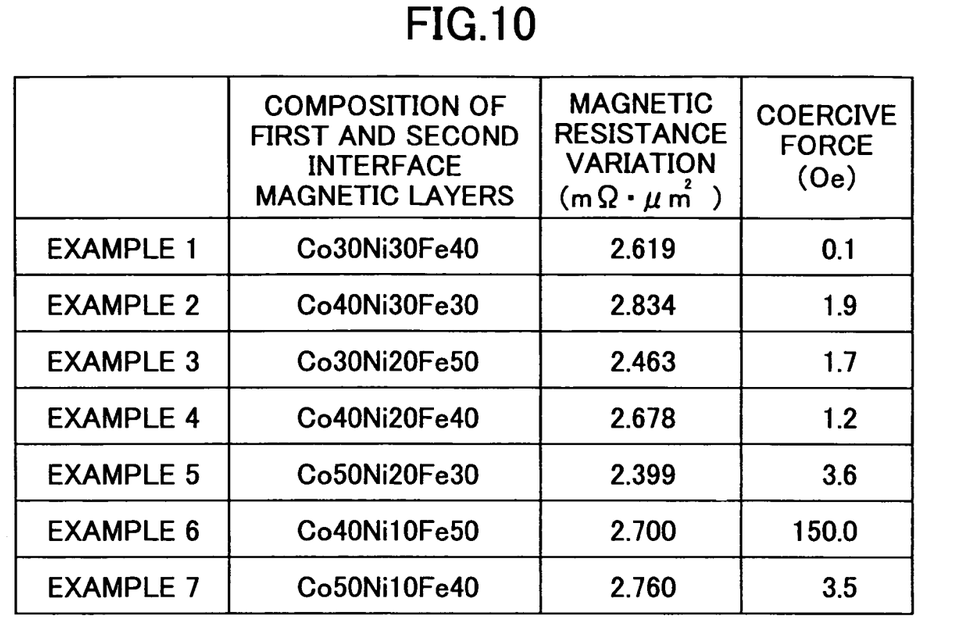
FIG. 10 is a table showing amount of magnetic resistance change and coercive force of a free magnetic layer of the magnetoresistive elements according to the according to first-seventh examples of the present invention.

First, a lower electrode is formed on a silicon substrate by forming a layered film which is layered with (beginning from the side toward the silicon substrate) Cu (250 nm)/Ti (30 nm)/Ta (10 nm)/NiFe (10 nm). Hereinafter, it is to be noted that each film is separated with a "/" (slash) and the value in the parenthesis indicates film thickness. Then, each film of a layered configuration (beginning from the substrate layer to the protective layer) provided with the following compositions and film thicknesses are formed by using a sputtering apparatus. It is to be noted the composition of the CoNiFe film of the first interface magnetic layer and the second interface magnetic layer (first-seventh example) is shown in the table of FIG. 10.

Then, a heating process is executed for providing an anti-ferromagnetic property for the anti-ferromagnetic layer. The heating process is executed under conditions where the heating temperature is 280° C., the processing time is 3 hours, and the applied magnetic field is 1952 kA/m.

Then, the obtained layered configuration is grinded by ion milling, to thereby obtain a layered configuration having 9 kinds of junction area ranging from 0.2 μm (length)×0.2 μm (width) to 1.0 μm (length)×1.0 μm (width). It is to be noted that twenty layered configurations for each junction area is obtained.

Then, the obtained layered configuration is covered with a silicon oxide film. Then, the layered configuration being covered with the silicon oxide film is dry-etched, thereby exposing the protective layer, and allowing the upper electrode formed of Au to contact the protective layer.

The composition and film thickness of the obtained layered configuration is shown below.

substrate layer: NiCr (4 nm)
lower anti-ferromagnetic layer: IrMn (5 nm)
lower first fixed magnetic layer: $Co_{60}Fe_{40}$ (2.24 nm)/$Co_{81}Fe_9Ru_{10}$ (2.5 nm)/$Co_{60}Fe_{40}$ (1 nm)
lower non-magnetic coupling layer: Ru (0.70 nm)
lower second fixed magnetic layer: $Fe_{45}Co_{45}Cu_{10}$ (3.75 nm)/$Fe_{60}Co_{40}$ (0.5 nm)
lower non-magnetic intermediate layer: Cu (3.5 nm)
first interface magnetic layer: CoNiFe (1.25 nm)
free magnetic layer: $Ni_{80}Fe_{20}$ (2.5 nm)
second interface magnetic layer: CoNiFe (1.25 nm)
upper non-magnetic intermediate layer: Cu (3.5 nm)
upper second fixed magnetic layer: $Fe_{60}Co_{40}$ (0.5 nm)/$Fe_{45}Co_{45}Cu_{10}$ (3.75 nm)
upper non-magnetic coupling layer: Ru (0.70 nm)
upper first fixed magnetic layer: $Co_{60}Fe_{40}$ (1 nm)/$CO_{81}Fe_9Ru_{10}$ (2.5 nm)/$Co_{60}Fe_{40}$ (2.24 nm)
upper anti-ferromagnetic layer: IrMn (5 nm)
protective layer: Ru (5 nm)

With reference to FIG. 10, the magnetoresistance change $\varDelta R$ of the magnetoresistive element of the first to seventh example was measured and an average magnetoresistance change $\varDelta R$ of each magnetoresistive element with a junction area A of substantially equal size was obtained. Then, the magnetoresistance change for a unit area $\varDelta RA$ is obtained from the obtained average magnetoresistance change $\varDelta R$ and the junction area A. Furthermore, after confirming that 9 kinds of magnetoresistive elements with different size junction areas A have substantially same magnetoresistance change $\varDelta RA$, the average of the magnetoresistance change $\varDelta RA$ was determined as the final value of magnetoresistance change $\varDelta RA$.

It is to be noted that the measuring of the magnetoresistance change $\varDelta R$ was performed under conditions where the electric current value of the sense current is 2 mA, the outer magnetic field is swept in a range from −79 kA/m to 79 kA/m in a direction parallel to the magnetization direction of the upper and lower second fixed magnetic layers, and the voltage between the upper and lower electrodes are measured with a digital voltmeter.

FIG. 10 shows a table indicating the magnetoresistance change $\varDelta R$ and the coercive force of the magnetoresistive elements of the first-seventh examples. The coercive force is the coercive force of the free magnetic layer (including the first interface magnetic layer and the second interface magnetic layer).

With reference to FIG. 10, the first-fifth examples, which include a first interface magnetic layer with a Ni content of 20 atom % and a second interface magnetic layer with a Ni content of 30 atom %, have a large magnetoresistance change. The inventors of the present invention found that the magnetoresistance change is approximately 1 mΩ·μm² or less in a case of a reference magnetoresistive element (reference example) having substantially the same configuration as the above-described examples except for being provided with no first and second interface magnetic layers and formed with a free magnetic layer of a $Ni_{80}Fe_{20}$ film with a thickness of 5 nm. In contrast, the first-fifth examples have a magnetoresistance change ranging from 2.4 to 2.8 which is more than twice the amount as that of reference example. Furthermore, the coercive force of the first-fifth examples is considerably lower than 10 Oe or less, in which the range of 10 Oe or less is a range preferable for practical use.

The sixth and seventh examples also have a magnetoresistance change which is substantially equal to those of the first-fifth examples. The sixth example, however, has a coercive force of 150 Oe, which considerably exceeds the range of 10 Oe or less. However, since the film thickness of the first interface magnetic layer and the second interface magnetic layer have a film thickness of 1.25 nm, a coercive force of 10 Oe or less may be obtained by reducing the film thickness to, for example, 0.5 nm.

Figure 11:
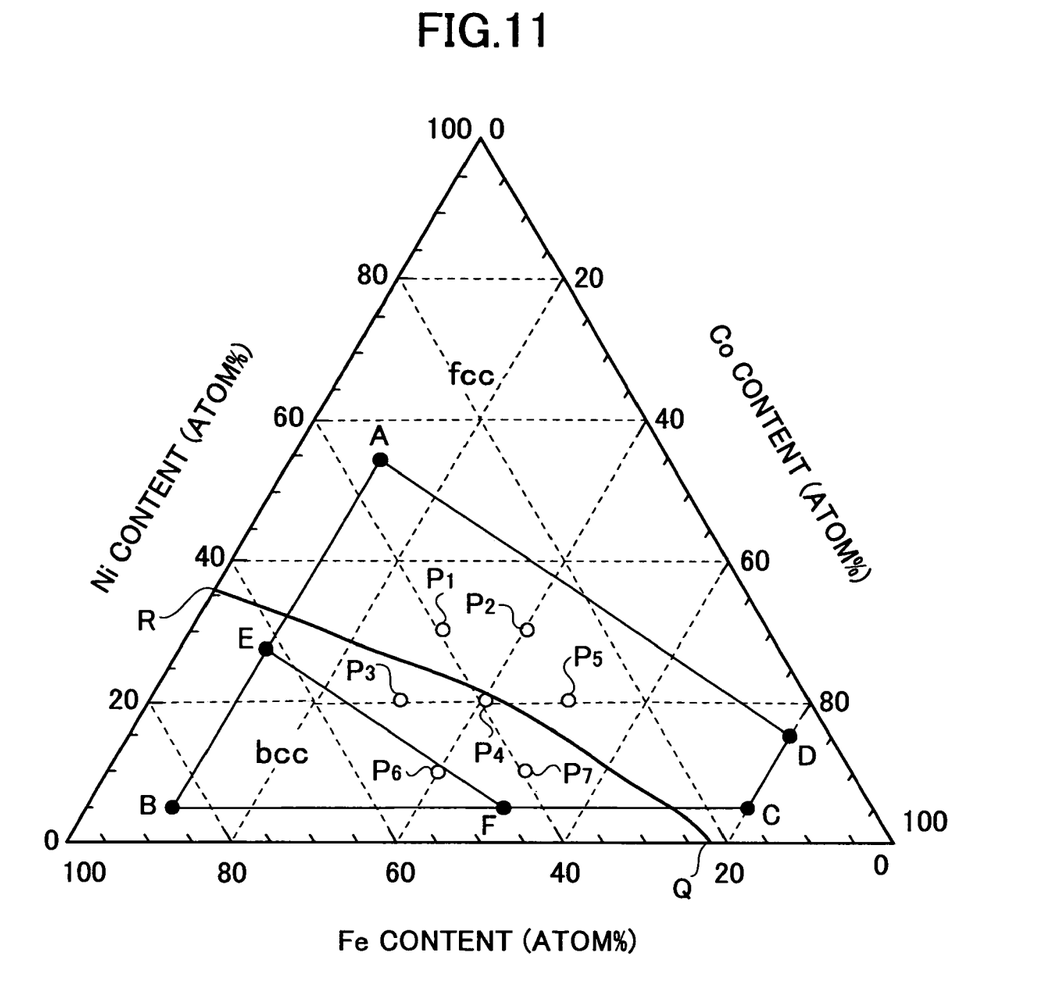
FIG. 11 is another diagram for explaining a composition of CoNiFe in a first interface magnetic layer and a second interface magnetic layer.

FIG. 11 is another diagram for explaining a composition of CoNiFe in a first interface magnetic layer and a second interface magnetic layer. In FIG. 11, the compositions of the first and second interface magnetic layers of the first-seventh examples are indicated with "$\varDelta$" marks, respectively. Furthermore, the reference numerals (points) $P_1$-$P_7$ correspond to the first-seventh examples, respectively. Furthermore, the composition range shown in FIG. 3 is also illustrated in FIG. 11.

As described above, the first-fifth examples, and the seventh example have large magnetoresistance change $\varDelta RA$ and low coercive force. Therefore, as shown in FIG. 11, a large magnetoresistance change $\varDelta RA$ and a free magnetic layer including a first interface magnetic layer and a second interface magnetic layer with low coercive force can be obtained with a composition falling in an area $P_1P_3P_7P_5P_2P_1$, which is delineated by connecting point P1 (30, 30, 40), point P3 (30, 20, 50), point P7 (50, 10, 40), point P5 (50, 20, 30), point P2 (40, 30, 30) and P1.

Furthermore, the inventors of the present invention found that coercive force hardly changes in a direction along the boundary line QR between a bcc structure and an fcc structure of an CoNiFe structure. Therefore, it can be assumed that a large magnetoresistance change $\varDelta RA$ and a free magnetic layer including a first interface magnetic layer and a second interface magnetic layer with low coercive force can be obtained at the side toward high Ni content and low Fe content with respect to a straight line being substantially parallel to the boundary line QR and connecting point E (10, 27.5, 62.5) and point F(50, 5, 45) without crossing over point $P_6$ (40, 10, 50). That is, a large magnetoresistance change $\Delta RA$ and a free magnetic layer including a first interface magnetic layer and a second interface magnetic layer with low coercive force can be obtained with a composition falling in an area AEFCDA, which is delineated by connecting point A (10, 55, 35), point E (10, 27.5, 62.5), point F (50, 5, 45), point C (80, 5, 15), point D (80, 15, 5) and point A. Therefore, by using applying a composition falling in this range to the first interface magnetic layer and the second interface magnetic layer, a satisfactory magnetoresistive element having large magnetoresistance change and a high sensitivity can be obtained.

Second Embodiment

Figure 12:
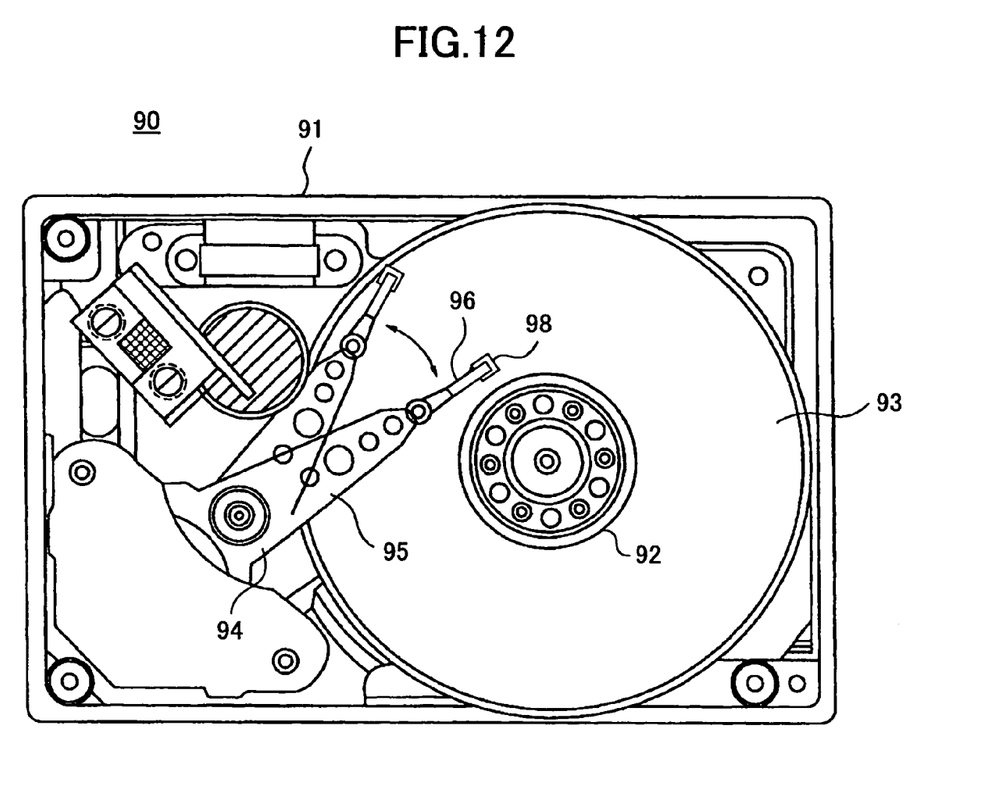
FIG. 12 is a plane view showing a portion of a magnetic memory apparatus according to a second embodiment of the present invention.

FIG. 12 is a plane view showing a portion of a magnetic memory apparatus according to a second embodiment of the present invention. In FIG. 12, the magnetic memory apparatus 90 includes a housing 91. The housing 91 includes: a hub 92 driven by a spindle (not shown); a magnetic recording medium 93 fixed to the hub 92 and rotated by the hub 92; an actuator unit 94; an arm 95 and suspension 96 which are attached to the actuator unit 94 and moved by the actuator unit 94 in a radial direction of the magnetic recording medium 93; and a magnetic head 98 which is supported by the suspension 96.

The magnetic recording medium 93 may be an in-plane magnetic recording type or a perpendicular magnetic recording type. The magnetic recording medium 93 may be a recording medium with inclined anisotropy. The magnetic recording medium 93 is not limited to a magnetic disk, but may alternatively be a magnetic tape.

As shown in FIG. 1, the magnetic head 98 includes a magnetic resistive element formed on a ceramic substrate and an induction type recording element formed thereon. The induction type recording medium may include known recording elements, for example, a ring type recording element for in-plane magnetic recording, or a magnetic monopole type recording element for perpendicular magnetic recording. The magnetoresistive element includes one of the GMR films of the first-seventh examples described in the first embodiment of the present invention. Therefore, the magnetoresistive element has large magnetoresistance change $\Delta RA$ and high sensitivity. Accordingly, the magnetic recording apparatus 90 provides satisfactory S/N ratio and enables recording in high density. It is to be noted that the basic configuration of the magnetic recording apparatus 90 of the second embodiment of the present invention is not limited to that shown in FIG. 12.

Further, the present invention is not limited to these embodiments, but various variations and modifications may be made without departing from the scope of the present invention.

The present application is based on Japanese Priority Application No. 2005-078007 filed on Mar. 17, 2005, with the Japanese Patent Office, the entire contents of which are hereby incorporated by reference.

What is claimed is:

1. A magnetoresistive element of a CPP type configuration including an antiferromagnetic layer, a fixed magnetic layer, a first non-magnetic layer, a free magnetic layer, and a second non-magnetic layer, the magnetoresistive element comprising:
    a ferromagnetic junction layer situated between the fixed magnetic layer and the antiferromagnetic layer;
    a first interface layer situated between the free magnetic layer and the first non-magnetic layer; and
    a second interface layer situated between the free magnetic layer and the second non-magnetic layer;
    wherein each of the first interface layer and the second interface layer includes a material mainly having CoNiFe;
    wherein the ferromagnetic junction layer formed of a ferromagnetic material has a saturation magnetic flux density higher than that of the fixed magnetic layer.

2. The magnetoresistive element as claimed in claim 1, wherein the film thickness of each of the first interface magnetic layer and the second interface magnetic layer is no less than 0.5 nm and no more than 2.0 nm.

3. The magnetoresistive element as claimed in claim 1, wherein each of the first interface magnetic layer and the second interface magnetic layer substantially includes only CoNiFe, wherein the CoNiFe has a composition falling in an area ABCDA when each component of CoNiFe is indicated with coordinates of(Co content, Ni content, Fe content) in a three dimensional state diagram, wherein the area ABCDA is delineated by connecting a point A (10, 55, 35), a point B (10, 5, 85), a point C (80, 5, 15), a point D (80, 15, 5) and the point A with straight lines, wherein the component value is expressed in atom %.

4. The magnetoresistive element as claimed in claim 1, wherein each of the first interface magnetic layer and the second interface magnetic layer substantially includes only CoNiFe, wherein the CoNiFe has a composition falling in an area AEFCDA when each component of CoNiFe is indicated with coordinates of(Co content, Ni content, Fe content) in a three dimensional state diagram, wherein the area AEFCDA is delineated by connecting a point A (10, 55, 35), a point E (10, 27.5, 62.5), a point F (50, 5, 45), a point C (80, 5, 15), a point D (80, 15, 5) and the point A with straight lines, wherein the component value is expressed in atom %.

5. The magnetoresistive element as claimed in claim 1, wherein the free magnetic layer includes a ferromagnetic material of at least one of Co, Ni, Fe, and an alloy including at least one of Co, Ni, Fe.

6. The magnetoresistive element as claimed in claim 5, wherein the free magnetic layer includes a ferromagnetic material mainly having NiFe.

7. The magnetoresistive element as claimed in claim 1, wherein the first interface magnetic layer and the second interface magnetic layer have substantially the same composition.

8. A magnetic head comprising:
    a recording element; and
    the magnetoresistive element of claim 1.

9. A magnetic memory apparatus comprising:
    a magnetic recording medium; and
    the magnetic head of claim 8.

* * * * *